United States Patent [19]

Nakatani et al.

[11] Patent Number: 5,297,098
[45] Date of Patent: Mar. 22, 1994

[54] CONTROL APPARATUS FOR DATA STORAGE APPARATUS

[75] Inventors: Kohichi Nakatani, Yokohama; Takashi Tsunehiro, Ebina, both of Japan

[73] Assignee: Hitachi, Ltd., Tokyo, Japan

[21] Appl. No.: 650,418

[22] Filed: Feb. 4, 1991

[30] Foreign Application Priority Data

Feb. 9, 1990 [JP] Japan .................................. 2-030940

[51] Int. Cl.⁵ ............................................. G11C 13/00
[52] U.S. Cl. ..................................... 365/226; 365/222; 365/227
[58] Field of Search ..................... 365/222, 226, 227

[56] References Cited
U.S. PATENT DOCUMENTS 4,985,869  1/1991  Miyamoto ........................... 365/226

Primary Examiner—Terrell W. Fears
Attorney, Agent, or Firm—Antonelli, Terry, Stout & Kraus

[57] ABSTRACT

A storage control apparatus for controlling memory elements having a data hold mode is provided with a switching circuit for switching a first voltage for a normal operation mode and a second voltage for the data hold mode as a power supply voltage applied to the memory elements, and a control circuit for controlling the switching operation of the switching circuit in accordance with accessing conditions of the memory elements. The control circuit is adapted to monitor accessing conditions of the respective memory elements and control the switching circuit to set all or a part of the memory elements except for accessed memory elements in the data hold mode.

15 Claims, 6 Drawing Sheets

CONTROL APPARATUS FOR DATA STORAGE APPARATUS

BACKGROUND OF THE INVENTION

1. Field of the Invention

The present invention relates to a control apparatus for a data storage apparatus, and more particularly to a control apparatus suitable for use in, for example, a main storage apparatus provided with a data hold mode which is capable of utilizing the data hold mode in which a power consumption is low even when the main storage apparatus is being accessed.

2. Related Art

In memory elements constituting a main storage apparatus in a computer or the like, an interruption of voltage supply causes data in the elements to be destroyed. However, known memory elements include one which is provided with a data hold mode such as a static RAM (hereinafter simply referred to as "SRAM"). The data hold mode is defined as a mode in which a supplied voltage is decreased below an allowable operation voltage in a non-select state of the memory elements, wherein data can be held if the supplied voltage presents a voltage value larger than a data hold voltage. In the data hold mode, merely several μA of a power supply current flows, and accordingly the power consumption is extremely low.

The related art has utilized this mode to perform a battery backup in case of system power supply interruption.

The following is a procedure of switching from the system power supply to a battery power supply:

(1) A voltage drop is detected in the system power supply;

(2) The memory elements are set to a non-select state; and (3) The power supply is switched from the system power supply to the battery power supply (the supply voltage of which is lower than that of the system power supply) to set the storage elements to a data hold mode.

For recovery, after confirming that the system power supply has been turned on, the storage elements are released from the non-select state after a time period required to recover the operation of the storage elements.

As explained above, the data hold mode in which the power consumption is low has been conventionally utilized only when the memory elements are backed up by a battery.

The above-mentioned related art has not considered reduction in the electric power consumed by the main storage apparatus except for the case where it is backed up by a battery. Specifically, when the system power supply is turned on, all memory elements are in either the operating state or the non-select state (hereinafter, the two states are collectively referred to as "the normal mode"), whereby the storage elements are never set in the data hold mode in which the power consumption is low.

SUMMARY OF THE INVENTION

It is an object of the present invention to provide a storage control apparatus which is capable of placing memory elements which are not required to be in the normal mode in the data hold mode, even when a voltage is supplied from the system power supply, to thereby reduce the electric power consumed by the main storage apparatus.

To achieve the above object, the present invention provides a storage apparatus provided with a data hold mode comprising a switch means for switching a first voltage for the normal mode and a second voltage for the data hold mode as a source voltage applied to the storage apparatus, and control means for controlling the switching operation of the switch means in accordance with access conditions of the memory elements.

Also, the present invention provides a storage apparatus composed of random access memories (DRAM) which comprises switching means for passing or interrupting a RAS signal and a CAS signal which are both supplied to the DRAM and control means for controlling the operation of the switching means in accordance with access conditions of the DRAMs.

According to the present invention, the control means monitors access conditions of the respective memory elements and discriminates elements which can be accessed with a high possibility and those with a low possibility. Then, the control means instructs the switching means of switching memory elements which have a low possibility of being accessed so that they should not be maintained in the normal mode in respect to the power consumption from the normal mode to the data hold mode. The switching means, in response to this instruction, switches those memory elements to the data hold mode. On the other hand, when a memory element in the data hold mode is accessed, the control means instructs the switching means to switch the concerned memory element to the normal mode. The switching means, in response to this instruction, first places the memory element in a non-select state and then in an operating state after an operation recovery time period.

According to the present invention, memory elements which need not be maintained in the normal mode are switched to the data hold mode in which the power consumption is lower, so that it is possible to reduce the power consumed by the main storage apparatus.

DESCRIPTION OF THE PREFERRED EMBODIMENTS

An embodiment of the present invention will hereinafter be explained in detail with reference to the accompanying drawings.

Figure 1:
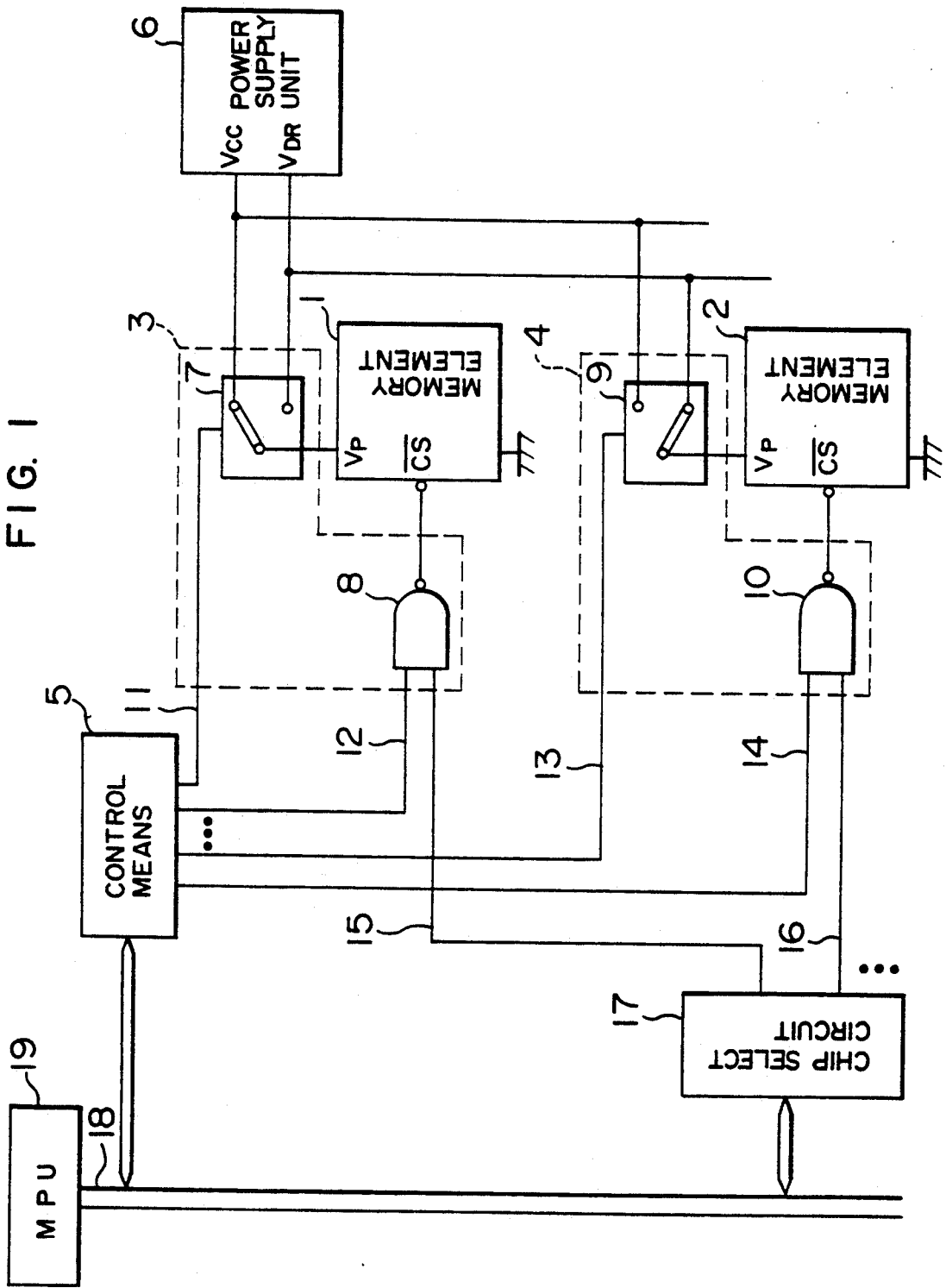
FIG. 1 is a block circuit diagram showing an embodiment of the present invention.

FIG. 1 is a structural diagram showing a main portion of an embodiment of the present invention comprising storage means and control means therefor. In the drawing, reference numerals 1, 2 designate memory elements for storing data composed, for example, of SRAM, the memory elements constituting a main storage apparatus. Reference numeral 6 designates a power supply unit for outputting an operation voltage (a source voltage) Vcc for operating the memory elements 1, 2 and a data hold voltage $V_{DR}$ for holding data stored in the memory elements. The voltages Vcc, $V_{DR}$ are in a relationship expressed by $Vcc < V_{DR}$. Reference numerals 3, 4 designate mode switching means for switching a mode of the memory elements 1, 2, more specifically, switching the same to either of a normal operation mode and a data hold mode. The switching means 3, 4 are composed of voltage change-over switches 7, 9 for selectively supplying a power supply terminal Vp of the respective memory elements 1, 2 with the voltage Vcc or $V_{DR}$ from the power supply unit 6 and chip select mask gates comprising logical circuits, for example, NAND gates 8, 10 for controlling a chip select terminal $\overline{CS}$ of the respective memory elements 1, 2 to access the memory element 1 or 2. Reference numeral 19 designates a microprocessor unit (MPU) for accessing the main storage apparatus and so on, 5 control means coupled to the MPU 19 through a system bus 18 as well as to the switching means 34. The control means 5 monitors access conditions of the memory elements 1, 2 controlled by the MPU 19 and performs a mode switch for the memory elements 1, 2. For example, the control means 5 is operative to set the memory element 1 in a normal operation mode by switching the voltage change-over switch 7 of the switching means 3 to the operation voltage Vcc side when the memory element 1 is accessed and to set the memory element 1 in a data hold mode by switching the voltage change-over switch 7 of the switching means 3 to the data hold voltage $V_{DR}$ side when the memory element 1 is in conditions other than the above-mentioned normal operation mode. The control means 5 is further operative to set the memory element 2 in the normal operation mode by switching the voltage change-over switch 9 of the switching means 4 to the operation voltage Vcc side when the memory element 2 is accessed and to set the memory element 2 in the data hold mode by switching the voltage change-over switch 9 of the switching means 4 to the data hold voltage $V_{DR}$ side when the memory element 2 is in conditions other than the normal operation mode. The control means 5 outputs mask signals 12, 14 for masking chip select signals 15, 16 from a chip select circuit 17, later referred to, by the gates 8, 10. The chip select mask gates 8, 10 mask the chip select signal 15 from the chip select circuit 17 in accordance with the mask signals 12, 14 from the control means 15. For example, the gate 8 masks the select signal 15 in accordance with the mask signal 12 from the control means 5 when the memory element 1 is accessed, while the gate 10 masks the chip select signal 15 in accordance with the mask signal 14 when the memory element 2 is accessed. The outputs from the chip select mask gates 8, 10 are coupled to a chip select terminal $\overline{CS}$ (active low) of the memory elements 1, 2, respectively.

The chip select circuit 17 is coupled to the MPU 19 through the system bus 18. The MPU 19 sets the chip select signal 15 to a high level for accessing the memory element 1 while it sets the chip select signal 16 to a high level for accessing the memory element 2.

Next, the operation of the control means 5 will be explained with reference to FIGS. 2 and 3.

Figure 2:
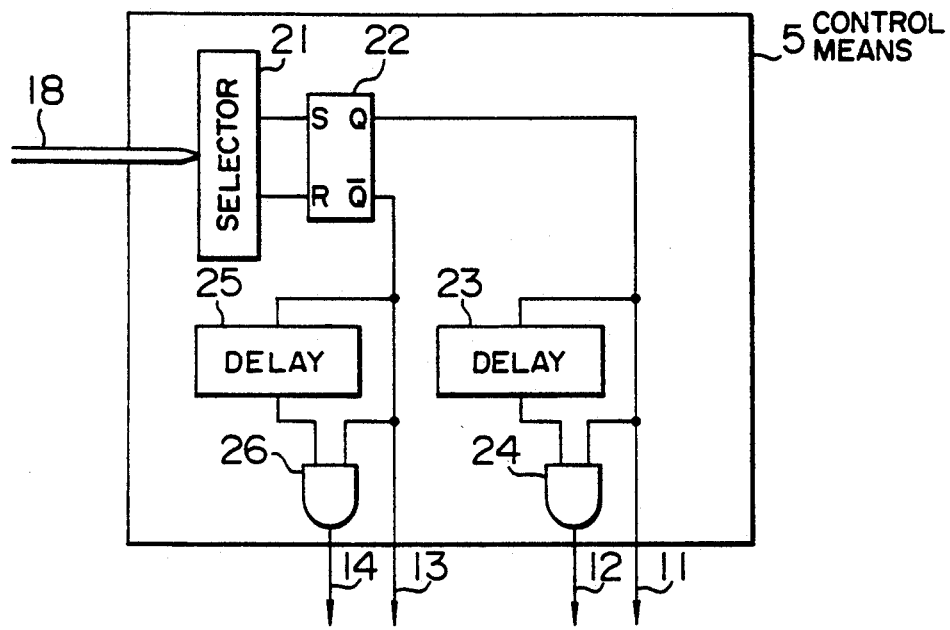
FIG. 2 is a block circuit diagram showing an example of the structure of control means shown in FIG. 1.
Figure 3:
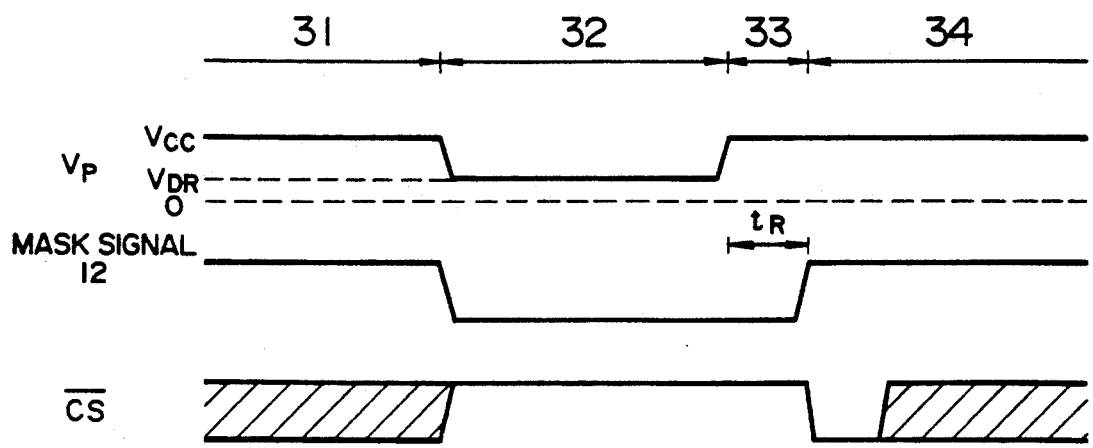
FIG. 3 is a timing chart showing a mode switching timing for the memory elements.

FIG. 2 shows an example of the structure of the control means 5, while FIG. 3 shows waveforms of the voltage at the power supply terminal Vp of the memory element 1, the mask signal 12 from the control means 5, and the chip select signal $\overline{CS}$ of the memory element 1 shown in FIG. 1. In FIG. 2, a selector 21 sets and resets an RS flip-flop 22 on the basis of an access request for the memory element 1 or 2 supplied thereto through the system bus 18. For example, when the memory element 1 is being accessed, the RS flip-flop is in a set state, and accordingly the Q output thereof is at a high level. This Q output at high level is outputted as a switching signal 11 and supplied to the voltage change-over switch 7 shown in FIG. 1, whereby the switch 7 is switched to the normal operation voltage mode side, thereby supplying the power supply terminal Vp of the memory element 1 with the power supply voltage Vcc. It should be noted that the Q output is delayed by a delay element 23 by a predetermined time period before being supplied to one of input terminals of an AND gate 24. The other input terminal of the AND gate 24 is supplied with the Q output directly from the RS flip-flop 22. Therefore, the AND gate 24 has its output (the mask signal 12) set at a high level after the lapse of a predetermined time period from the time when the Q output of the RS flip-flop 22 is set at high level. This output of the AND gate 24 is delivered as the mask signal 12 to the chip select mask gate 8 shown in FIG. 1. This mask signal 12 is operative to prohibit the gate 8 from masking the chip select signal 15. More specifically, the chip select signal 15 (at a high level) is inverted (at a low level) and inputted to the $\overline{CS}$ terminal of the memory element 1. The above relationship corresponds to a region 31 shown in FIG. 3. In this region 31, the memory element 1 is set in the normal operation mode. At this time, the $\overline{Q}$ output of the flip-flop 22 or a switching signal 13 is at a low level, while a mask signal 14 outputted through a delay element 25 and an AND gate 26 is also at a low level.

Next, when an access to the memory element 2 is started, the selector 21 shown in FIG. 2 resets the RS flip-flop 22, whereby the Q output of the RS flip-flop 22 goes low. At this time, the switching signal 11 also goes low, whereby the voltage change-over switch 7 of the switching means 3 is switched to the data hold mode side to supply the power supply terminal Vp of the memory element 1 with the power supply voltage $V_{DR}$. Also, the mask signal 12 immediately goes low. Thus, the chip select mask gate 8 shown in FIG. 1 masks the chip select signal 15, which results in setting the $\overline{CS}$ terminal of the memory element 1 at a high level (non-select state). The above relationship corresponds to a region 32 shown in FIG. 3. In this region, the memory element 1 is switched to the data hold mode, wherein the power consumption is reduced.

Subsequently, when an access to the memory element 1 is started, the selector 21 shown in FIG. 2 sets the RS flip-flop 22 to immediately return the switching signal 11 to high level. However, the mask signal 12 returns to high level after a delay of a predetermined time period $t_R$ provided by the delay element 23. This delay $t_R$ is equal to an operation recovery time period necessary to change from the data hold mode to the normal operation mode. After this operation, the $\overline{CS}$ terminal of the memory element 1 goes low, whereby an access to the memory element 1 is started. The above relationship corresponds to regions 33 and 34 shown in FIG. 3, wherein the region 33 indicates the operation recovery time period (non-select state) and the region 34 the normal mode.

The foregoing explanation has been made in view of the mode switching for the memory element 1. The mode switching for the memory element 2 is also performed by means of the Q output of the RS flip-flop, the delay element 25 and the AND gate 26 shown in FIG. 2. Incidentally, the selector 21 and the flip-flop 22 may be replaced by registers which can store arbitrary data. This structure is useful when more than three memory elements are included.

Figure 9:
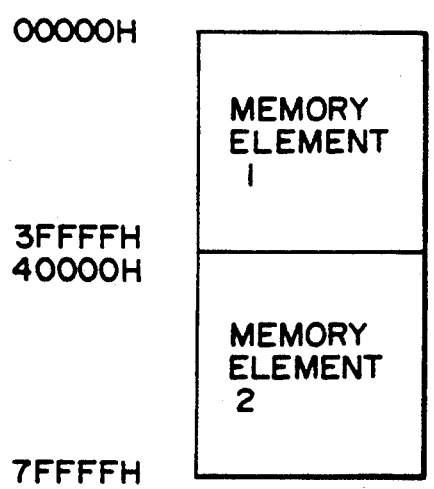
FIG. 9 is a diagram showing a memory map for a main storage apparatus.

As mentioned above, a switching operation from the data hold mode to the normal operation mode requires the operation recovery time period $t_R$ therebetween. Therefore, frequent mode switching operations are not preferable in respect to the performance. To cope with this problem, a memory map of the main storage apparatus may be divided into two areas i.e., upper and lower areas, as shown in FIG. 9, wherein the upper area is assigned to the memory element 1 and the lower area to the memory element 2, by way of example. This is because programs and data are generally located in a particular area of the memory, so that the memory element 1 or 2 may be continually accessed with a high possibility, which results in reducing the frequency of the switching operation from the data hold mode to the normal operation mode. Incidentally, FIG. 9 shows a memory map where the capacity of the main storage apparatus is 512 kB and the upper 256 kB area is assigned to the memory element 1 while the lower 256 kB is assigned to the memory element 2.

Figure 4:
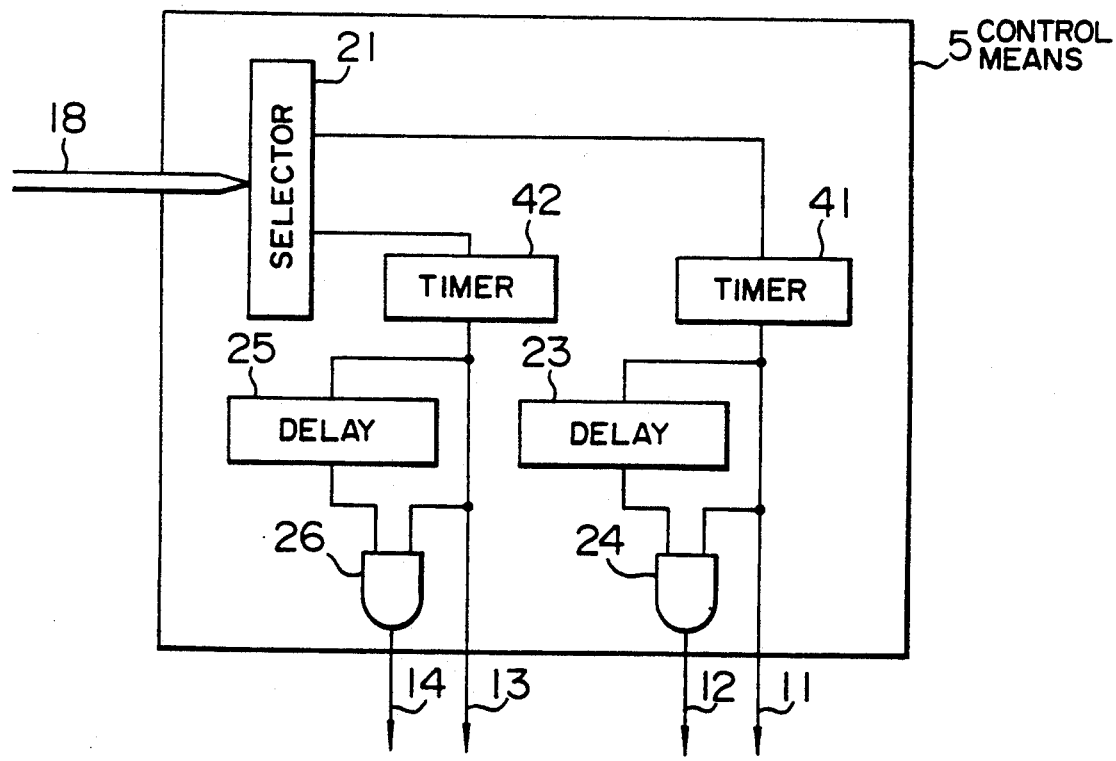
FIG. 4 is a block circuit diagram showing another example of the structure of the control means shown in FIG. 1.

FIG. 4 shows another example of the structure of the control means 5, wherein the RS flip-flop 22 is replaced with timers 41, 42. A selector 21 shown in FIG. 4 resets the timer 41 each time the memory element 1 is accessed. The timer 41 starts measuring the time from a reset time and maintains its output at high level for a time period previously set by the user. In other words, the timer 41 places and maintains the memory element 1 in the normal operation mode during the previously set time period. When the set time period has elapsed, the timer 41 sets its output at low level to switch the memory element 1 to the data hold mode. If the timer 41 is reset during a time measurement, the timer 41 resumes the time measurement from the reset time. The timer 42 is also reset each time the memory element 2 is accessed, and operates in a manner similar to the timer 41.

As described above, an accessed memory element is maintained in the normal operation mode at least during the previously set time period. It is therefore possible that both the memory elements 1 and 2 are simultaneously set in the normal operation mode, different from the case where the control means shown in FIG. 2 is employed. A long time period set in the timers may result in reducing the frequency of switching to the data hold mode. Nevertheless, the frequency of switching from the data hold mode to the normal operation mode is also reduced. On the contrary, setting a short time period in the timers will cause an increase in the frequency of switching to the data hold mode, however, the frequency of switching from the data hold mode to the normal operation mode is also increased. Therefore, the user can previously set a time period appropriate to respective use modes in consideration of the power consumption and the performance.

Next, the operation of the voltage change-over switch 7 and the chip select mask gate 8 will be explained with reference to FIGS. 5 and 6.

Figure 5:
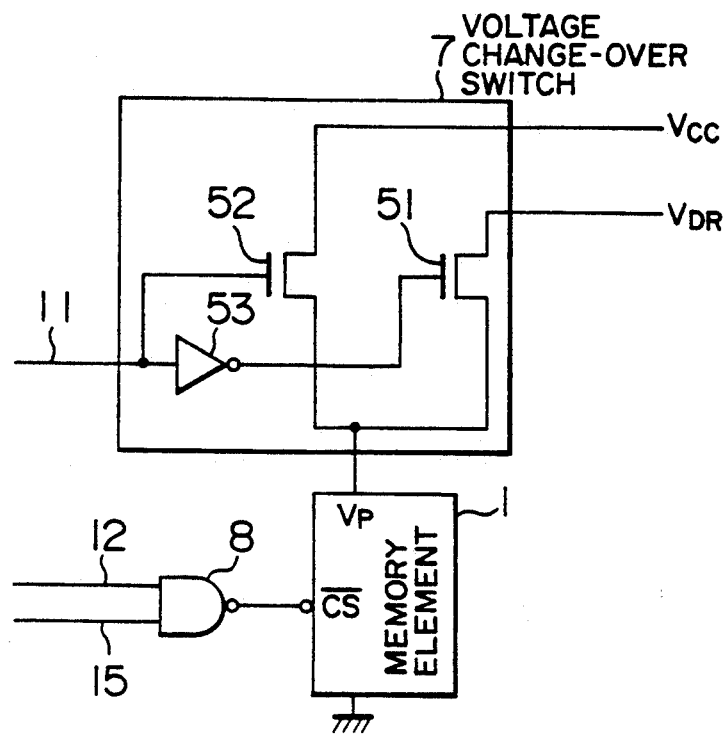
FIG. 5 is a schematic circuit diagram showing an example of the structure of a voltage change-over switch shown in FIG. 1.

FIG. 5 shows an example of the structure of the voltage change-over switch constituting the switching means shown in FIG. 1. In the drawing, the voltage change-over switch 7 is composed of MOS transistors 51, 52 and an inverter 53. When the switching signal 11 is at a high level, the MOS transistor 52 is in the on state while the MOS transistor 51 is in the off state, whereby the power supply voltage Vcc (the operation voltage) is supplied to the power supply terminal Vp of the memory element 1. When the switching signal 11 is at a low level, the MOS transistor 52 is in the off state while the MOS transistor 51 is in the on state, whereby the power supply voltage $V_{DR}$ (the data hold voltage) is supplied to the power supply terminal Vp.

Figure 6:
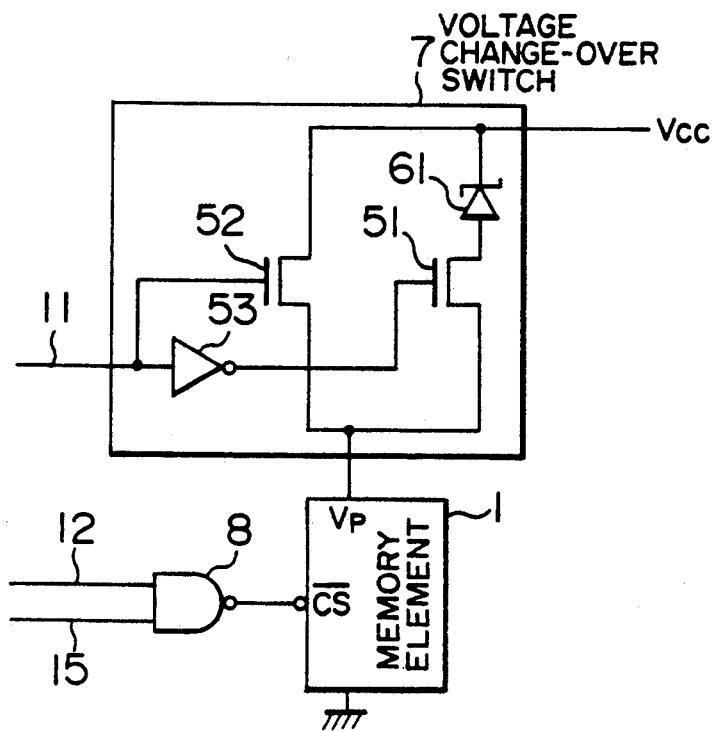
FIG. 6 is a schematic circuit diagram showing another example of the structure of the voltage change-over switch shown in FIG. 1.

FIG. 6 shows another example of the structure of the voltage change-over switch 7, wherein a zener diode 61 for voltage drop is interposed between the MOS transistor 51 and a power supply line coupled to the power supply voltage Vcc. When the switching signal 11 is at a low level, the power supply voltage Vcc is dropped by the zener diode 61 to the data hold voltage which is supplied to the power supply terminal Vp of the memory element 1 through the MOS transistor 51 in the on state. Thus, the voltage change-over switch 7 shown in FIG. 6 differs from that of FIG. 5 in that the data hold voltage $V_{DR}$ is not supplied from outside the voltage change-over switch but is generated internally.

As shown in FIGS. 5 and 6, the voltage change-over switch 7 is constituted of a simple transistor circuit, thereby making it possible to integrate the whole switching means including the chip select mask gate 8 in a single chip together with the memory elements.

The above embodiment of the present invention has been explained giving a case where the main storage apparatus includes two memory elements, but, can be implemented in a similar manner in a case where the main storage apparatus includes three or more memory elements.

Next, another embodiment of the present invention will be explained with reference to FIGS. 7 and 8. The present embodiment is an example which is applied to a case where dynamic RAM (hereinafter referred to as "DRAM") is employed for memory elements.

Figure 7:
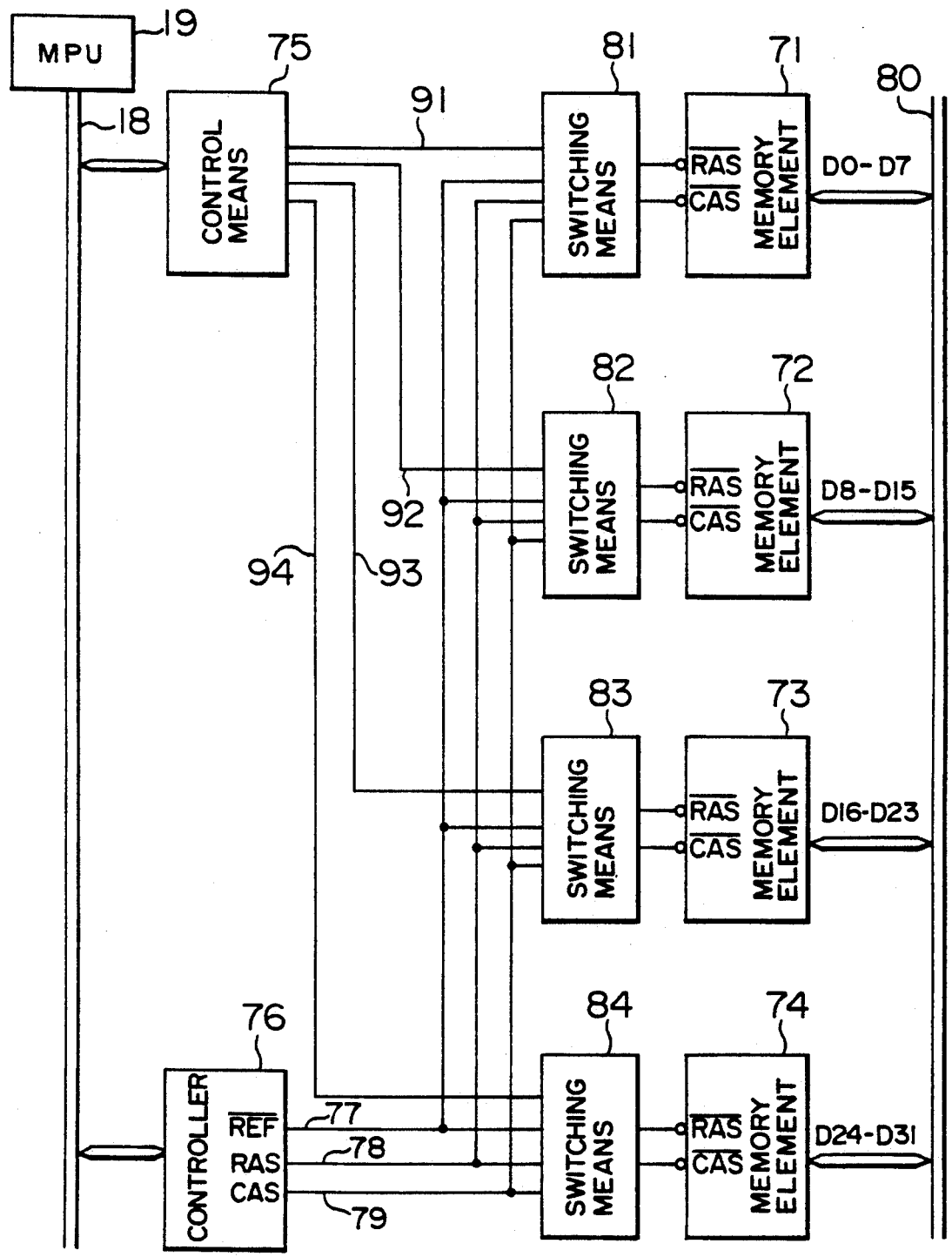
FIG. 7 is a block circuit diagram showing another embodiment of the present invention.

In FIG. 7, a data bus 80 has a 32 bit width (the respective bits are designated D0–D31), and memory elements 71–74 are used to read and write data on portions D0–D7, D8–D15, D16–D23 and D24–D31 of the data bus 80, respectively. In other words, 32 bit data is divided into four bytes and managed by the respective memory elements.

A controller 76 is coupled to a MPU 19 through a system bus 18 and outputs DRAM access signals (a RAS signal 78 and a CAS signal 79) and a refresh signal (a $\overline{REF}$ signal 77) to all the memory elements on the basis of a DRAM access request generated by the MPU 19.

A control means 75 is also coupled to the MPU 19 through the system bus 18 and outputs switching signals 91–94 indicating corresponding memory elements to respective switching means 81-84 on the basis of a byte enable signal (indicating which byte of the 32 bit data is to be accessed) generated by the MPU 19. For example, if bytes corresponding to the memory elements 71, 72 are to be accessed, the control means 75 sets the switching signals 91, 92 at a high level. The switching means 81, 82, upon receiving the switching signals 91, 92, supply the output signals of the controller 76 to the respective memory elements 71, 72. More specifically, a $\overline{RAS}$ terminal and a $\overline{CAS}$ terminal of the respective memory elements 71, 72 are made active (set to a low level). On the other hand, the switching signals 93, 94 go low, which has the switching means 83, 84 set the $\overline{RAS}$ terminal and the $\overline{CAS}$ terminal of the respective memory elements 73, 74 at a high level, whereby the memory elements 73, 74 are placed in a low power consumption state (a non-select state).

Figure 8:
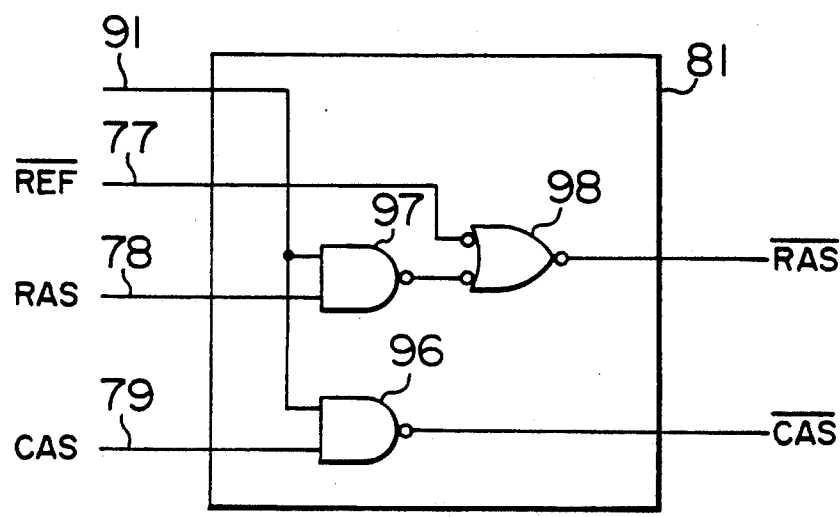
FIG. 8 is a logical circuit diagram showing an example of the structure of switching means shown in FIG. 7.

FIG. 8 illustrates an example of the structure of the switching means 81 shown in FIG. 7. It should be noted that the other switching means 82, 83 and 84 are constituted in the same manner. In the drawing, when the switching signal 91 is at a high level, a NAND gate 97 does not mask the RAS signal 78. Likewise, a NAND gate 96 does not mask the CAS signal 79. Therefore, when the RAS signal 78 and the CAS signal 79 are both active (at a high level), the $\overline{RAS}$ terminal and the $\overline{CAS}$ terminal of the memory element are also active (at a low level). Incidentally, when the REF signal 77 is active (at a low level) for a data hold, or when a refresh request is generated, the $\overline{RAS}$ terminal is made active (set at a low level) through an AND gate 98, irrespective of the level of the switching signal 91.

The present embodiment utilizes a non-select state with a low power consumption in the normal operation mode and therefore is effective in use for a memory element which does not have a data hold mode.

According to the present invention as explained above, upon accessing the main storage apparatus, all memory elements constituting the same are not set in the normal operation mode, wherein memory elements assumed to be accessed with a low possibility are switched to the data hold mode with a low power consumption, thereby producing effects in reducing the power consumption of the main storage apparatus.

We claim:

1. A control apparatus for a data storage apparatus comprising:
   storage means for storing data and having a power supply terminal to which a first voltage and a second voltage different from said first voltage are selectively supplied to switch said storage means between a normal electric power consumption state and a low electric power consumption state wherein an electric power consumption of said storage means is lower than in said normal electric power consumption state;
   switching means for selectively supplying said first voltage and said second voltage to said power supply terminal of said storage means, thereby switching said storage means between said normal electric power consumption state and said low electric power consumption state;
   access means for selectively accessing said storage means; and
   control means for detecting accessing of said storage means performed by said access means, for controlling said switching means to supply said first voltage to said power supply terminal of said storage means when said access means is accessing said storage means, thereby switching said storage means to said normal electric power consumption state, and for controlling said switching means to supply said second voltage to said power supply terminal of said storage means when said access means is not accessing said storage means, thereby switching said storage means to said low electric power consumption state.

2. An apparatus according to claim 1, wherein said storage means comprises a memory element having a power supply terminal and a data hold mode;
   said access means comprises an MPU (MICROPROCESSOR UNIT) for selectively accessing said memory element;
   said switching means comprises a power supply for generating a normal operation voltage as said first voltage and a data hold voltage lower than said normal operation voltage as said second voltage, and a voltage change-over switch circuit for selectively supplying said normal operation voltage and said data hold voltage to said power supply terminal of said memory element; and
   said control means comprises a switching signal generating circuit for outputting a switching signal for switching said voltage change-over switch circuit to a normal operation mode for supplying said normal operation voltage to said power supply terminal of said memory element when said MPU is accessing said memory element, and for switching said voltage change-over switch circuit to a data hold mode for supplying said data hold voltage to said power supply terminal of said memory element when said MPU is not accessing said memory element.

3. An apparatus according to claim 1, wherein said storage means comprises a memory element having a power supply terminal and a chip select terminal;
   said access means comprises an MPU (MICROPROCESSOR UNIT) for selectively accessing said memory element, and a chip select circuit for outputting a chip select signal for setting said chip select terminal in a select state when said MPU is accessing said memory element and for setting said chip select terminal in a non-select state when said MPU is not accessing said memory element;
   said switching means comprises a power supply for generating at least a normal operation voltage as said first voltage, means for generating a data hold voltage lower than said normal operation voltage as said second voltage, and a voltage change-over switch circuit for selectively supplying said normal operation voltage and said data hold voltage to said power supply terminal of said memory element, and a chip select mask gate for selectively passing said chip select signal to said chip select terminal and masking said chip select signal from said chip select terminal; and
   said control means comprises a switching signal generating circuit for outputting a switching signal for switching said voltage change-over switch circuit to a normal operation mode for supplying said normal operation voltage to said power supply terminal of said memory element when said CPU is accessing said memory element, and for switching said voltage change-over switch circuit to a data hold mode for supplying said data hold voltage to said power supply terminal of aid memory element when said MPU is not accessing said memory element, and a mask signal generating circuit for outputting a mask signal for controlling said chip select mask gate to pass said chip select signal to said chip select terminal when said MPU is accessing said memory element, and for controlling said chip select mask gate to mask said chip select signal from said chip select terminal when said MPU is not accessing said memory element.

4. An apparatus according to claim 3, wherein said MPU generates an access signal indicating whether or not said MPU is to access said memory element;
   wherein said switching signal generating circuit comprises a selector for outputting a set signal or a rest signal based on said access signal from said MPU, and an RS flip-flop which is set or reset by said set signal or said reset signal from said selector, said RS flip-flop producing an output signal indicating whether said RS flip-flop is set or reset and outputting said output signal as said switching signal; and
   wherein said mask signal generating circuit comprises a delay circuit for delaying said output signal from said RS flip-flop by a predetermined time period to produce a delayed signal, and a logical circuit for outputting said mask signal for controlling said chip select mask gate to pass said chip select signal when said delayed signal from said delay circuit and said output signal from said RS flip-flop are both at a high level, and for outputting said mask signal for controlling said chip select mask gate to mask said chip select signal when said delayed signal from said delay circuit and said output signal from said RS flip-flop are not both at a high level.

5. An apparatus according to claim 3, wherein said MPU generates an access signal indicating whether or not said MPU is to access said memory element;
   wherein said switching signal generating circuit comprises a selector for outputting a reset signal based on said access signal from said MPU each time said access signal indicates that said MPU is to access said memory element, and a timer which is reset by said reset signal from said selector, which outputs said switching signal for switching said voltage change-over switch circuit to said normal operation mode during a predetermined time period beginning at a time said timer is reset by said reset signal from said selector, and which outputs said switching signal for switching said voltage change-over switch circuit to said data hold mode side after said predetermined time period has elapsed; and
   wherein said mask signal generating circuit comprises a delay circuit for delaying said switching signal from said timer by a predetermined time period to produce a delayed signal, and a logical circuit for outputting said mask signal for controlling said chip select mask gate to pass said chip select signal when said delayed signal from said delay circuit and said switching signal from said timer are both at a high level, and for outputting said mask signal for controlling said chip select mask gate to mask said chip select signal when said delayed signal from said delay circuit and said switching signal from said timer are not both at a high level.

6. An apparatus according to claim 3, wherein said power supply generates said data hold voltage, thereby constituting said means for generating a data hold voltage, and wherein said voltage change-over switch circuit comprises a first MOS (METAL OXIDE SEMICONDUCTOR) transistor which is turned on and off by said switching signal, an inverter for inverting said switching signal to produce an inverted signal, and a second MOS transistor which is turned on and off by said inverted signal from said inverter, wherein said first MOS transistor supplies said normal operation voltage to power supply terminal of said memory element when said first MOS transistor is on, and said second MOS transistor supplies said data hold voltage to power supply terminal of said memory element when said second MOS transistor is on.

7. An apparatus according to claim 3, wherein said voltage change-over switch circuit comprises a first MOS transistor which is turned on and off by said switching signal, an inverter for inverting said switching signal to produce an inverted signal, a second MOS transistor which is turned on and off by said inverted signal from said inverter, and a voltage dropping zener diode for dropping said operation voltage to said data hold voltage, said voltage dropping zener diode thereby constituting said means for generating a data hold voltage, wherein said first MOS transistor supplies said normal operation voltage to said power supply terminal of said memory element when said first MOS transistor is on, and said second MOS transistor supplies said data hold voltage to said power supply terminal of said memory element when said second MOS transistor is on.

8. An apparatus according to claim 1, wherein said storage means comprises a plurality of memory elements each having a power supply terminal and a chip select terminal; and
   said access means comprises an MPU (MICROPROCESSOR UNIT) for selectively accessing said memory elements, and a chip select circuit for outputting a respective chip select signal for each memory element of said plurality of memory elements for setting said chip select terminal of said each memory element in a select state when said MPU is accessing said each memory element and for setting said chip select terminal of said each memory element in a non-select state when said MPU is not accessing said each memory element;
   said switching means comprises a power supply for generating a normal operation voltage as said first voltage and a data hold voltage lower than said normal operation voltage as said second voltage, and a respective voltage change-over switch circuit for each memory element of said plurality of memory elements for selectively supplying said normal operation voltage and said data hold voltage to said power supply terminal of said each memory element, and a respective chip select mask gate for each memory element of said plurality of memory elements for selectively passing said chip select signal for said each memory element to said chip select terminal of said each memory element and masking said chip select signal for said each memory element from said chip select terminal of said each memory element;
   said control means comprises a respective switching signal generating circuit for each memory element of said plurality of memory elements for outputting a switching signal for switching said voltage change-over switch circuit for said each memory element to a normal operation mode for supplying said normal operation voltage to said power supply terminal of said each memory element when said MPU is accessing said each memory element, and for switching said voltage change-over circuit for said each memory element to a data hold mode for supplying said data hold voltage to said power supply terminal of said each memory element when said MPU is not accessing said each memory element, and a respective mask signal generating circuit for each memory element of said plurality of memory elements for outputting a mask signal for controlling said chip select mask gate for said each memory element to pass said chip select signal for said each memory element to said chip select terminal of said each memory element when said MPU is accessing said each memory element, and for controlling said chip select mask gate for said each memory element to mask said chip select signal for said each memory element from said chip select terminal of said each memory element when said MPU is not accessing said each memory element; and when said MPU is accessing any one memory element of said plurality of memory elements, said voltage change-over switch circuit for at least one other memory element of said plurality of memory elements is switched to said data hold mode.

9. An apparatus according to claim 1, wherein said control means controls said switching means so as to maintain said storage means in said normal electric power consumption state during a predetermined constant time period after said access means accesses said storage means.

10. An apparatus according to claim 1, wherein said control means comprises means for preventing said access means from accessing said storage means for at least a predetermined operation recovery time period after said control means controls said switching means to switch said storage means from said low electric power consumption state to said normal electric power consumption state.

11. A control apparatus for a data storage apparatus comprising:

first and second memory elements having a power supply terminal and a chip select terminal, for storing data;

access means for accessing said first and second memory elements; said access means comprising an MPU (MICROPROCESSOR UNIT) for outputting an access signal and a chip select signal for accessing said memory elements and a power supply for generating a first normal operation voltage and a second data hold voltage which is lower than said first normal operation voltage;

first and second voltage switch means for switching said first and second memory elements between a normal operation voltage state and a data hold voltage state with a lower voltage than said normal operation voltage state; said first and second switch means respectively comprising voltage change-over switch circuits for selectively supplying the power supply terminal of the respective memory elements with said first normal operation voltage and said second data hold voltage and chip select mask gates coupled to receive chip select signals corresponding to said respective memory elements from said MPU for setting the respective chip select terminal of said first and second memory elements in a select or non-select state; and control means for detecting access conditions of said first and second memory elements based on an access signal from said MPU constituting said access means; said control means comprising switching signal generating circuits for outputting switching signals for switching said first and second voltage switch means to said normal operation voltage mode when said first and second memory elements are accessed while switching the same to said low data hold voltage mode when said first and second memory elements are not accessed, and circuits for controlling said chip select mask gates so as to set said chip select terminal in the select state when said first and second memory elements are accessed and controlling to mask said chip select signal so as to set said chip select terminals in the non-select state when said memory elements are not accessed, characterized by switching said switching means to either of the normal operation mode with the normal operation voltage and the data hold mode with a low electric power consumption in accordance with access conditions of said first and second memory elements.

12. A control apparatus for a data storage apparatus comprising:

a plurality of memory elements having a first access terminal and a second access terminal;

access means for accessing said plurality of memory elements; said access means comprising an MPU (MICROPROCESSOR UNIT) for outputting respective access signals and a byte enable signal for accessing said plurality of memory elements and a controller for outputting access signals and a refresh signal based on an access request generated from said MPU;

a plurality of said switching means for switching said first and second access terminals of said memory elements between a normal electric power consumption state and a low electric power consumption state in which an electric power consumption is lower than said normal electric power consumption state; said switching means comprising switch circuits coupled to receive a switching signal, said access signal and said refresh signal for setting the access terminals of said memory elements in an active state with a predetermined electric power consumption when said switching signal is at high level or when said access signals or said refresh signal is active while switching the same to an inactive state with a low electric power consumption when said signals are in states other than those mentioned above;

control means for detecting access conditions of said memory elements based on an access signal from the MPU constituting said access means and controlling said switch circuits to said normal electric power consumption state when said memory elements are accessed while switching the same to said low electric power consumption state when said memory elements are not accessed; said control means comprising switching signal generating circuits for outputting said switching signals corresponding to said accessed memory elements to said switch circuits when said memory elements are accessed, characterized by controlling said change-over switch circuits, when any of the plurality of said memory elements is accessed, such that all or at least a portion of the remaining memory elements are set in said low electric power consumption mode.

13. A control apparatus for a data storage apparatus comprising:

a dynamic random access memory (DRAM) for storing data, the DRAM having an access terminal to which an access signal having a first level and an access signal having a second level different from the first level are selectively supplied, the access signal having the first level placing the DRAM in a normal electric power consumption state wherein the DRAM can be accessed, and the access signal having the second level placing the DRAM in a low electric power consumption state wherein the DRAM cannot be accessed;

a microprocessor (MPU) for outputting a DRAM access request signal indicating that at least one of a plurality of DRAMs is to be accessed, the plurality of DRAMs including the DRAM, and for outputting a byte enable signal having a first level when the DRAM is included in that at least one of the plurality of DRAMs to be accessed and having a second level different from the first level when the DRAM is not included in that at least one of the plurality of DRAMs to be accessed;

control means for outputting a DRAM access signal having a first level when the MPU is outputting the DRAM access request signal and having a second level different from the first level when the MPU is not outputting the DRAM access request signal, for outputting a refresh signal having a first level when the DRAM is to be refreshed and having a second level different from the first level when the DRAM is not to be refreshed, and for outputting a switching signal having a first level when the byte enable signal from the MPU has the first level and having a second level different from the first level when the byte enable signal from the MPU has the second level; and switching means for supplying the access signal having the first level to the access terminal of the DRAM when the DRAM access signal has the first level and the switching signal has the first level or when the refresh signal has the first level, thereby switching the DRAM to the normal electric power consumption state wherein the DRAM can be accessed, and for otherwise supplying the access signal having the second level to the access terminal of the DRAM, thereby switching the DRAM to the low electric power consumption state wherein the DRAM cannot be accessed.

14. An apparatus according to claim 13, wherein the switching means includes:

a first gate circuit for outputting the access signal having the first level when the DRAM access signal has the first level and the switching signal has the first level, and for otherwise outputting the access signal having the second level; and a second gate circuit for outputting the access signal having the first level to the access terminal of the DRAM when the refresh signal has the first level, and for outputting the access signal from the first gate circuit to the access terminal of the DRAM when the refresh signal has the second level.

15. A control apparatus for a data storage apparatus comprising:

a plurality of memory elements for storing data, each memory element of the plurality of memory elements having a first access terminal and a second access terminal to which a first access signal and a second access signal are respectively supplied so as to selectively place the corresponding memory element in an active normal electric power consumption state wherein the corresponding memory element can be accessed and an inactive low electric power consumption state wherein the corresponding memory element cannot be accessed;

a microprocessor (MPU) for outputting a memory access request signal indicating that at least one memory element of the plurality of memory elements is to be accessed, and for outputting a byte enable signal indicating which memory element or memory elements of the plurality of memory elements is or are to be accessed;

control means for outputting a third access signal and a fourth access signal indicating whether or not at least one memory element of the plurality of memory elements is to be accessed based on the memory access request signal, for outputting a refresh signal indicating whether or not the plurality of memory elements are to be refreshed, and for outputting a respective switching signal for each memory element of the plurality of memory elements indicating whether or not the corresponding memory element is to be accessed based on the byte enable signal; and switching means including a respective switching circuit for each memory element of the plurality of memory elements, the respective switching circuit supplying the first access signal and the second access signal to the first access terminal and the second access terminal, respectively, of the corresponding memory element so as to place the corresponding memory element in the active normal electric power consumption state or the inactive low electric power consumption state based on the third access signal, the fourth access signal, the refresh signal, and the respective switching signal such that when at least one memory element of the plurality of memory elements is in the active normal electric power consumption state, at least one other memory element of the plurality of memory elements is in the inactive low electric power consumption state.

* * * * *